United States Patent
Iacoponi et al.

(10) Patent No.: US 6,228,754 B1
(45) Date of Patent: May 8, 2001

(54) METHOD FOR FORMING SEMICONDUCTOR SEED LAYERS BY INERT GAS SPUTTER ETCHING

(75) Inventors: John A. Iacoponi, San Jose; Dirk Brown, Santa Clara; Takeshi Nogami, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,661

(22) Filed: Jan. 5, 1999

(51) Int. Cl.[7] .................. H01L 21/302; H01L 21/28
(52) U.S. Cl. .................. 438/618; 438/691; 438/701; 438/672
(58) Field of Search .................. 438/618, 627, 438/629, 625, 628, 639, 642, 643, 656, 685, 669, 672, 692, 633, 687, 648, 691, 700, 701, 710

(56) References Cited

U.S. PATENT DOCUMENTS

| 5,081,064 | * | 1/1992 | Inoue et al. ............... 438/625 |
| 5,658,829 | * | 8/1997 | Mathews et al. .......... 438/656 |
| 6,001,730 | * | 12/1999 | Farkas et al. .............. 438/627 |
| 6,080,669 | * | 1/1999 | Iacopni et al. ............. 438/672 |
| 6,096,651 | * | 8/2000 | Wang et al. ............... 438/691 |

\* cited by examiner

*Primary Examiner*—Matthew Smith
*Assistant Examiner*—Igwe U. Anya
(74) *Attorney, Agent, or Firm*—Mikio Ishimaru

(57) ABSTRACT

A method is provided for forming seed layers in semiconductor device channels or vias by using an inert gas sputter etching technique. The technique etches back the seed layers which results in a reduction of seed layer overhang at the top of the channels or vias, thereby enhancing the subsequent filling of the channel or vias by conductive materials.

22 Claims, 2 Drawing Sheets

METHOD FOR FORMING SEMICONDUCTOR SEED LAYERS BY INERT GAS SPUTTER ETCHING

CROSS-REFERENCE TO RELATED APPLICATION

The present application contains subject matter related to a concurrently filed U.S. Patent Application by John A. Iacoponi, Dirk Brown, and Takeshi Nogami entitled "METHOD FOR FORMING SEMICONDUCTOR SEED LAYERS BY HIGH BIAS DEPOSITION". This and the related application, are commonly assigned to Advanced Micro Devices, Inc.

TECHNICAL FIELD

The present invention relates generally to semiconductors and more specifically to processing seed materials used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), or titanium nitride (TiN) are used as barrier materials for copper.

Thus, a thin adhesion layer formed of an adhesion material, such as titanium, is first deposited on the dielectrics or vias to ensure good adhesion and good electrical contact of the subsequently deposited barrier layers to underlying doped regions and/or conductive channels. Adhesion/barrier layer stacks formed of adhesion/barrier materials such as tantalum/tantalum nitride (Ta/TaN) and titanium/titanium nitride (Ti/TiN) have been found to be useful as adhesion/barrier material combination for copper interconnects.

After deposition of the adhesion/barrier material, a seed layer is deposited on top. The copper seed layers for copper interconnect in a damascene process are typically deposited by physical vapor deposition (PVD) or derivatives of PVD techniques. The common problems associated with most of these deposition techniques are poor sidewall step coverage and conformality, i.e., the seed layer thickness is much higher in wide-open areas, such as on top of the channel oxide layer and in the upper portion of the sidewalls of the channels and vias than in the lower portion of the sidewalls of the channels and vias. To guarantee a currently required minimum seed layer thickness of 10 nm anywhere in the channel or vias, including at the lower portion of the sidewalls, the seed layer thickness in wide-open areas tends to be much higher than 10 nm. As the width of the channels and vias have decreased in size due to the size reduction in the semiconductor devices, an excessively thick seed layer in the wide-open areas interferes with the subsequent filling of the channel and vias with conductive materials.

A solution, which would form uniform seed layers in channel or vias and improve the subsequent filling of the channel or vias by conductive materials, has long been sought, but has eluded those skilled in the art. As the semiconductor industry is moving from aluminum to copper and other type of materials with greater electrical conductivity and thinner channels and vias, it is becoming more pressing that a solution be found.

DISCLOSURE OF THE INVENTION

The present invention provides a method for forming seed layers in channels or vias by using an inert gas sputter etching technique. The technique etches back the seed layers which results in a reduction of seed layer overhang at the top of the channels or vias, thereby enhancing the subsequent filling of the channel or vias by conductive materials.

The present invention still further provides a method for forming seed layers in channel or vias with improved step coverage and conformality.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
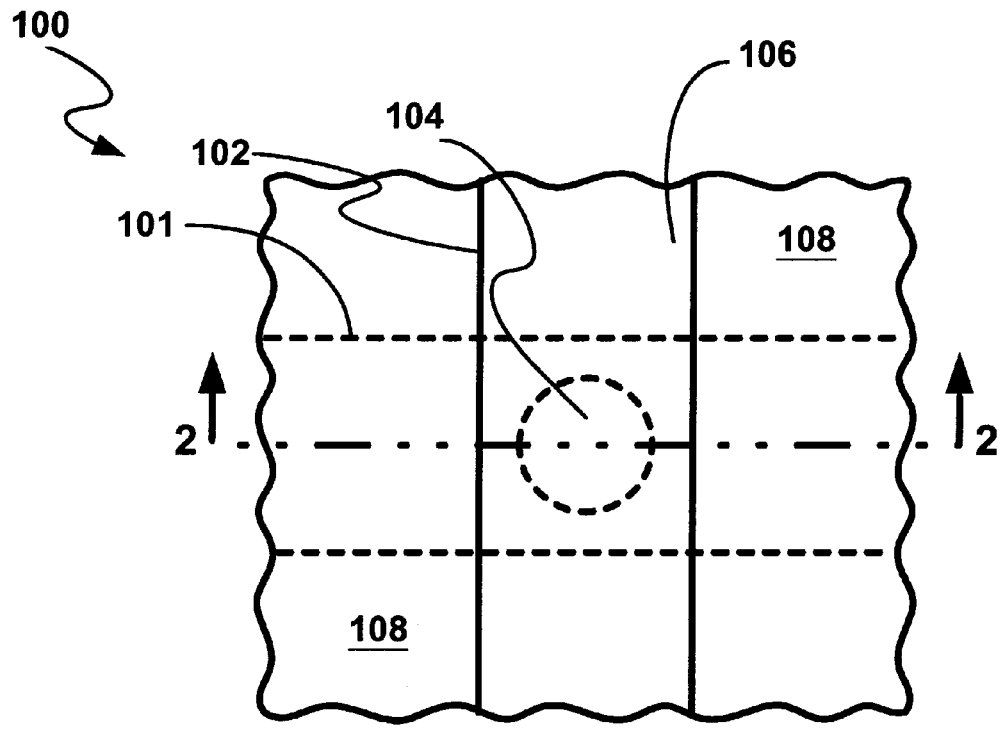
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
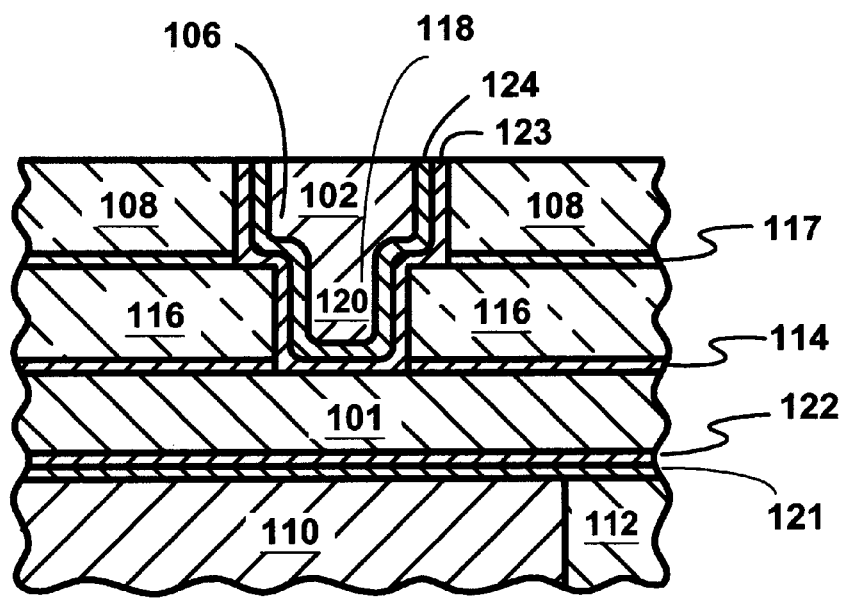
FIG. 1B (PRIOR ART) is a cross-section of FIG. 1A (PRIOR ART) along line 2—2.

Referring now to FIG. 1B (PRIOR ART), therein is shown a cross-section of FIG. 1A (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are an adhesion/barrier layer 121 and seed layer 122, and around the second channel 102 and the cylindrical via 120 is an adhesion/barrier layer 123 and seed layer 124. The adhesion/barrier layers include adhesion/barrier material combinations such as titanium/titanium nitride and tantalum/tantalum nitride for copper seed layers and copper or copper alloy conductive materials.

Figure 1C:
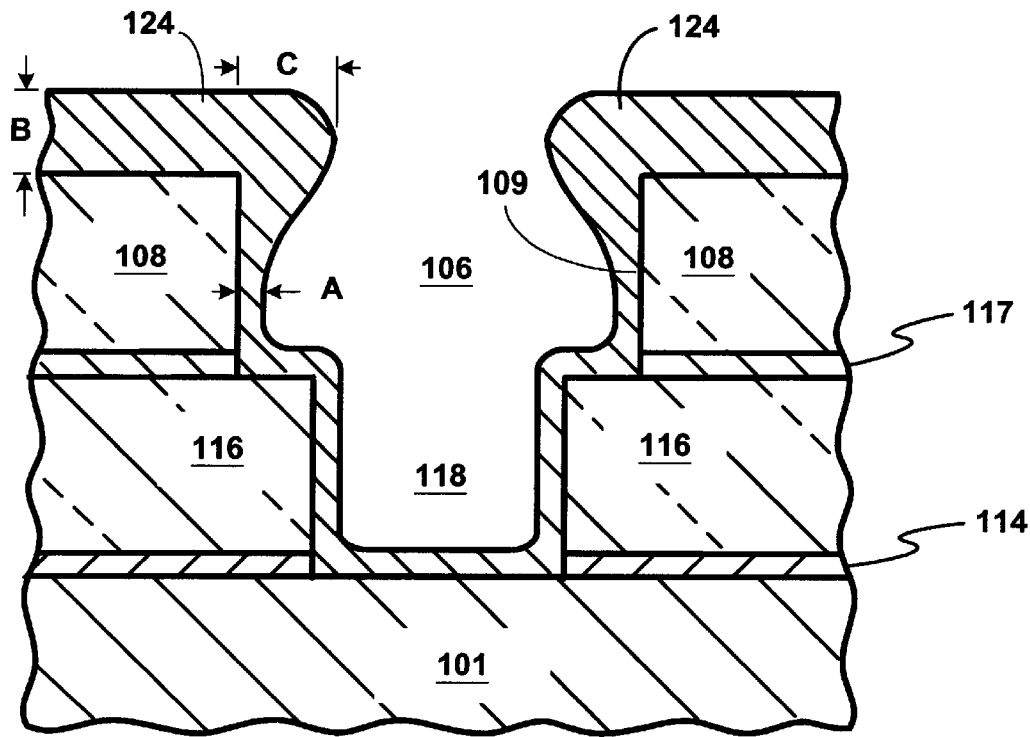
FIG. 1C (PRIOR ART) is a simplified cross-section of FIG. 1A (PRIOR ART) along line 2—2 immediately after the deposition of seed material in the second channel opening.

Referring now to FIG. 1C (PRIOR ART), therein is shown the cross section of the semiconductor wafer 100 along 2—2 immediately after the deposition of the seed layer 124 and prior to the filling of the second channel opening 106 and via 118 with the second conductive material. For purpose of clarity, the adhesion layer 123, barrier layer 122, adhesion layer 121, polysilicon gate 110 and dielectric 112 are not shown.

The common problems associated with most of PVD techniques and their derivatives, which are used for seed layer deposition, are poor sidewall step coverage and conformality, i.e., the seed layer thickness is much higher in wide-open areas, such as on top of the second channel oxide layer 108 and in the upper portion of the sidewalls 109 of the second channel opening 106. The sidewall step coverage and conformality are defined as follows:

Sidewall step coverage=A/B

Conformality=A/C where A is the thickness of the thinnest area of the seed layer 124 along the sidewalls 109, B is the thickness of the seed layer 124 on top of the second channel oxide layer 108, and C is the thickness, or overhang, of the thickest area of the seed layer 124 along the sidewalls 109. It is desirable to have high values in sidewall step coverage and conformality. In this case, since A is much smaller than either B or C, the sidewall step coverage and conformality would be low, indicating poor sidewall step coverage and conformality.

To guarantee a minimum seed layer thickness of 10 nm anywhere in the channel opening 106, including at the lower portion of the sidewalls 109, the seed layer thickness in the wide-open areas tends to be much higher than 10 nm. Further, as the width of the channels and vias have decreased in size due to the size reduction in the semiconductor devices, an excessively thick seed layer in the upper portion of the sidewalls of the second channel opening 102 would interfere with the subsequent filling of the second channel opening 106 and via 118 with the second conductive material.

Figure 2:
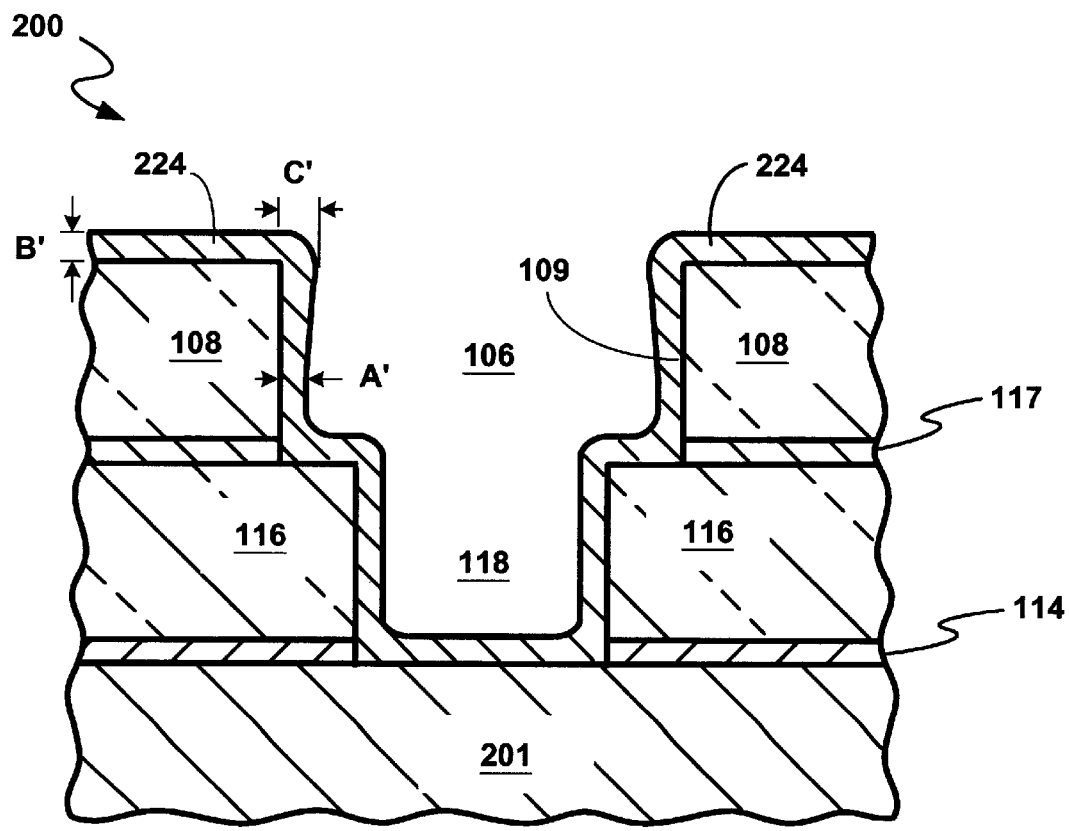
FIGS. 2 is a simplified cross-section of a semiconductor wafer formed in accordance with the present invention.

Referring to FIG. 2, therein is shown the cross-section of a semiconductor wafer 200 with a pair of perpendicularly aligned semiconductor channels, disposed over a silicon substrate 110 formed in accordance with the present invention. For convenience of illustration, like reference numerals are used in FIG. 2 to denote like elements already described in FIG. 1A (PRIOR ART) through FIG. 1C (PRIOR ART). Similarly, for purposes of clarity, the adhesion/barrier layer 123, seed layer 122, adhesion/barrier layer 121, polysilicon gate 110 and dielectric 112 are not shown.

At this stage a seed layer 224 is shown formed in the second channel opening 106 after a partial etch back using inert gas sputter etching but prior to the filling of second channel opening 106 and via 118 with the second conductive material.

The sputter etching is an isotropic etching, which removes more seed material from the wide-open areas, such as on top of the second channel oxide layer 108 and in the upper portion of the sidewalls 109 of the second channel opening 106, and results in a thinner seed layer around the wide-open areas and more even coverage on the sidewalls 109. Specifically, the thickness of the seed layer 224 on top of the second channel oxide layer 108 (B') and the thickness of the thickest area of the seed layer 224 along sidewalls 109 (C') are reduced significantly due the etch back, while the thickness of the thinnest area of the seed layer 224 along the sidewalls 109 (A') has not changed much. Accordingly, both the sidewall step coverage (A'/B') and conformality (A'/C') have increased.

In addition, since the etch back step mainly removes excessive seed layer thickness around the wide-open areas, the thickness seed layer 224 in the lower portion of the sidewall is generally not much affected. Therefore, the uniformity of the seed layer 224 around the second channel opening 102 is not adversely impacted. Finally, as the excessive seed layer thickness is removed from around the upper portion of the sidewalls 109, it allows proper filling of the second channel opening 102 with the second conductive material subsequently. The seed layers so formed improve the adhesion of the conductive materials and enhance the subsequent filling of the channel or vias by conductive materials.

In production, a conventional first damascene process was used to dispose a first channel 201 in a first channel oxide layer (not shown) above portions of a semiconductor device (not shown) on a production semiconductor wafer 200. The damascene process is a photolithographic process which uses a mask to define a first channel opening (not shown) in the first channel oxide layer. The first channel opening is then filled with a adhesion/barrier layer, a seed layer, and a first conductive material, such as copper, to form the first channel 201 using conventional metal deposition technique, such as physical vapor deposition, chemical vapor deposition, electroplating, or a combination thereof. The stop nitride layer 114, the via oxide layer 116, and the via nitride layer 117 would be successively deposited on top of the first channel 201 and the first channel oxide layer using conventional deposition technique.

By using the via photoresist and the via photolithographic process followed by nitride etching of a round via 104 in the via nitride layer 117, the basis for the cylindrical via 118 was formed. The subsequent deposition of the second channel oxide layer 108 prepared the way for the second channel 106 to be perpendicular to the first channel 201.

The second damascene process uses a further mask to define the second channel opening 106 in the second channel oxide layer 108. Since the second damascene process uses an anisotropic oxide etch, the etch also forms the cylindrical via 118 down to the stop nitride layer 114. The anisotropic oxide etch etches faster in the vertical direction of FIG. 2 than in the horizontal direction. The nitride etch of the stop nitride layer 114 exposes a portion of the first channel 201 and completes the etching steps.

Next, a thin adhesion/barrier layer (not shown) is deposited in the second channel opening 106 and the cylindrical via 118, including along the walls of the second channel opening 106 and the cylindrical via 118. The thickness of the adhesion/barrier material is insufficient to fill the second channel opening 106 and the cylindrical via 118. Examples of suitable adhesion/barrier materials include refractory combinations as titanium/titanium nitride and tantalum/tantalum nitride. The adhesion/barrier layer is deposited using conventional deposition techniques, such as physical vapor deposition, chemical vapor deposition, or a combination thereof.

Thereafter, a thin seed layer 224 is deposited on the adhesion/barrier layer in the second channel opening 106 and the cylindrical via 118. Again, the thickness of the seed layer 224 is insufficient to fill the second channel opening 106 and the cylindrical via 118. Examples of suitable seed materials include copper and copper alloys. The seed layer 224 is deposited using a conventional metal deposition technique such as ion metal plasma (IMP) or hollow cathode metalization (HCM). In these processes, the metal ions are charged and directed toward the silicon wafer 200 to be deposited.

The deposition of the seed layer 224 is followed by an etch back process using inert gas sputter etching techniques in accordance with the present invention. An inert gas, such as argon or xenon, is introduced into the metal deposition chamber in which the seed layer 224 is being deposited. The inert gas is then ionized into plasma and the inert gas ions charged. Using DC/RF energy, the inert gas ions are directed to impact on the seed layer 224 and sputter, or knock off, the excessive seed layer material in the wide-open areas around the second channel opening 106. This sputter etching process will affect the near surface area and not etch much of the seed layer 224 around the lower portion of the sidewalls 109.

The sputter etching parameters such as the inert gas pressure and DC/RF power can be adjusted to optimize the etching process so that the excessive seed layer thickness in the wide-open areas around the second channel opening 106 are removed while the thickness of the resultant seed layer anywhere in the second channel opening 106 still meets the minimum seed layer thickness requirement. The sputter etching process is advantageous because it can be performed at a lower temperature than reactive plasma etching and this is highly desirable for conductive materials such as copper which are subject to agglomeration at high temperatures.

Next, the second conductive material is deposited into second channel opening 106 and via 118 on top of the seed layer 224 using conventional metal deposition technique, such as physical vapor deposition, chemical vapor deposition, electroplating, electro-less plating or a combination thereof. Thereafter, a chemical mechanical polishing process is used to complete the conventional connection process similar to what were shown and described in FIGS. 1A and 1B.

Accordingly, by using an inert gas sputter etching technique to etch back the seed layer, the present invention forms seed layers in channel openings or vias which enhance the proper filling of the channel openings or vias by conductive materials.

While the best mode utilizes copper as the conductive material, it should be understood that the present invention is applicable to other conductive materials such as aluminum, doped polysilicon, copper, gold, silver, an alloy thereof, and a combination thereof.

Further, although the embodiments of the present invention are directed to using the dual damascene technique, it also will be recognized by those skilled in the art that other techniques of forming interconnects or other traditional techniques of forming low resistance contacts or plugs which involve filling an opening with conductive materials such as tungsten or aluminum may be used to practice the present invention. In addition, while the embodiments of the present inventions form a seed layer in a channel opening and a via atop another conductive channel, it should be understood that the present invention is applicable to forming a seed layer in a channel opening and/or a via atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:
   providing a semiconductor with a dielectric layer formed thereon, wherein said dielectric layer overlays a region on said semiconductor;
   forming an opening in said dielectric layer, said opening defined by walls of said dielectric layer and exposing a portion of said region on said semiconductor;
   forming a seed layer over said dielectric layer and in said opening, including along said walls, said seed layer formed to a thickness insufficient to fill said opening;
   sputter etching said seed layer to reduce its thickness at least on top of said dielectric layer and around an upper portion of said walls; and
   forming a layer of conductive material in contact with said seed layer, said conductive material layer substantially filling said opening.

2. The method as claimed in claim 1 wherein the step of sputter etching said seed layer is performed by inert gas sputter etching.

3. The method as claimed in claim 1 wherein the step of sputter etching said seed layer increases sidewall step coverage and conformality of said seed layer, sidewall step coverage is defined to be A/B and conformality is defined to be A/C, where A is the thickness of the thinnest area of said seed layer along said walls, B is the thickness of said seed layer on said dielectric layer, and C is the thickness of the thickest area of said seed layer along said walls.

4. The method as claimed in claim 1 including the steps of:
   forming an adhesion/barrier layer on said dielectric layer and in said opening, including along said walls, in contact with said region of said semiconductor substrate to bond said seed layer thereto; and
   forming of said adhesion/barrier layer by a process selected from a group comprising physical vapor deposition, chemical vapor deposition, and a combination thereof.

5. The method as claimed in claim 1 including the steps of:
   forming an adhesion/barrier layer on said dielectric layer and in said opening, including along said walls, in contact with said region of said semiconductor to bond said seed layer thereto; and
   forming of said adhesion/barrier layer is performed with a material selected from a group comprising titanium, tantalum, titanium nitride, tantalum nitride, and combinations thereof.

6. The method as claimed in claim 1 wherein the step of forming said seed layer is performed by a process selected from a group comprising physical vapor deposition, ion metal plasma, chemical vapor deposition, and a combination thereof.

7. The method as claimed in claim 1 wherein said step of forming said seed layer is performed with a material selected from a group comprising aluminum, copper, gold, silver, an alloy thereof and a combination thereof.

8. The method as claimed in claim 1 wherein the step of forming said layer of conductive material is performed by a process selected from a group comprising physical vapor deposition, chemical vapor deposition, electroplating, and a combination thereof.

9. The method as claimed in claim 1 wherein said step of forming said layer of conductive material is performed with a material selected from a group comprising aluminum, doped polysilicon, copper, gold, silver, an alloy thereof, and a combination thereof.

10. The method as claimed in claim 1 wherein said region is a conductive channel formed on said semiconductor substrate.

11. The method as claimed in claim 1 wherein said region is a doped region formed on said semiconductor substrate.

12. A method of manufacturing a semiconductor device, comprising the steps of:
   providing a semiconductor substrate with a dielectric layer formed thereon, wherein said dielectric layer overlays a region on said semiconductor substrate;
   forming an opening in said dielectric layer, said opening defined by walls of said dielectric layer and exposes a portion of said region on said semiconductor substrate;
   forming an adhesion/barrier layer on said dielectric layer and in said opening, including along said walls, in contact with said region of said semiconductor substrate, said adhesion/barrier layer formed to a thickness insufficient to fill said opening, wherein the step of forming said adhesion/barrier layer is performed by physical vapor deposition, chemical vapor deposition, or a combination thereof;
   forming a seed layer in contact with said adhesion/barrier layer, said seed layer formed to a thickness insufficient to fill said opening, wherein the step of forming said seed layer is performed by physical vapor deposition, chemical vapor deposition, or a combination thereof;
   inert gas sputter etching said seed layer to reduce its thickness at least on top of said dielectric layer and around an upper portion of said walls, wherein the step of etching increases sidewall step coverage and conformality of said seed layer, sidewall step coverage is defined to be A/B and conformality is defined to be A/C, where A is the thickness of the thinnest area of said seed layer along said walls, B is the thickness of said seed layer on said dielectric layer, and C is the thickness of the thickest area of said seed layer along said walls; and
   forming a layer of conductive material in contact with said seed layer, said conductive material layer substantially filling said opening, wherein said step of forming said layer of conductive material is performed by a process selected from a group comprising physical vapor deposition, chemical vapor deposition, electroplating, and a combination thereof.

13. The method as claimed in claim 12 wherein said step of inert gas sputter etching uses an inert gas selected from a group comprising argon and xenon.

14. The method as claimed in claim 12 wherein said step of forming said adhesion/barrier layer is performed with a material selected from a group comprising titanium, tantalum, titanium nitride, tantalum nitride, and combinations thereof.

15. The method as claimed in claim 12 wherein said step of forming said seed layer is performed with a material selected from a group comprising aluminum, copper, gold, silver, an alloy thereof, and a combination thereof.

16. The method as claimed in claim 12 wherein said step of forming said layer of conductive material is performed with a material selected from a group comprising aluminum, doped polysilicon, copper, gold, silver, an alloy thereof and a combination thereof.

17. The method as claimed in claim 12 wherein said region is a conductive channel formed on said semiconductor substrate.

18. The method as claimed in claim 12 wherein said region is a doped region formed on said semiconductor substrate.

19. A method of manufacturing a semiconductor device, comprising the steps of:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming an adhesion/barrier layer comprising a material selected from the group comprising titanium, tantalum, titanium nitride, and tantalum nitride on said dielectric layer and in said opening, including along said walls, in contact with said region of said semiconductor substrate, said adhesion/barrier layer formed to a thickness insufficient to fill said opening, wherein the step of forming said adhesion/barrier layer is performed by a process selected from a group comprising physical vapor deposition, chemical vapor deposition, and a combination thereof;

forming a seed layer comprising a material selected from the group comprising aluminum, tungsten, doped polysilicon, copper, gold, silver, alloys and combinations thereof, said seed layer in contact with said adhesion/barrier layer, said seed layer formed to a thickness insufficient to fill said opening, wherein the step of forming said seed layer is performed by physical vapor deposition, chemical vapor deposition, or a combination thereof;

inert gas sputter etching said seed layer to reduce its thickness at least on top of said dielectric layer and around an upper portion of said walls, wherein the step of etching increases sidewall step coverage and conformality of said seed layer, sidewall step coverage is defined to be A/B and conformality is defined to be A/C, where A is the thickness of the thinnest area of said seed layer along said walls, B is the thickness of said seed layer on said dielectric layer, and C is the thickness of the thickest area of said seed layer along said walls; and forming a layer of conductive material in contact with said seed layer, wherein said conductive material is selected from a group comprising aluminum, tungsten, doped polysilicon, copper, gold, silver, alloys and combinations thereof, said conductive material layer substantially fills said opening, and the step of forming said layer of conductive material is performed by a process selected from a group comprising physical vapor deposition, chemical vapor deposition, electroplating, and a combination thereof.

20. The method as claimed in claim 19 wherein said step of inert gas sputtering etching uses an inert gas selected from a group comprising argon and xenon.

21. The method as claimed in claim 19 wherein said region is a conductive channel formed on said semiconductor substrate.

22. The method as claimed in claim 19 wherein said region is a doped region formed on said semiconductor substrate.

* * * * *